United States Patent [19]
Kurokawa

[11] Patent Number: 5,258,075
[45] Date of Patent: Nov. 2, 1993

[54] PROCESS FOR PRODUCING PHOTOCONDUCTIVE MEMBER AND APPARATUS FOR PRODUCING THE SAME

[75] Inventor: Takashi Kurokawa, Yokohama, Japan

[73] Assignee: Canon Kabushiki Kaisha, Tokyo, Japan

[21] Appl. No.: 873,629

[22] Filed: Apr. 23, 1992

Related U.S. Application Data

[63] Continuation of Ser. No. 734,116, Jul. 25, 1991, abandoned, which is a continuation of Ser. No. 338,524, Apr. 14, 1989, abandoned, which is a continuation of Ser. No. 883,865, Jul. 14, 1986, abandoned, which is a continuation of Ser. No. 624,697, Jun. 26, 1984, abandoned.

[30] Foreign Application Priority Data

Jun. 30, 1983 [JP] Japan .................................. 118748
Jul. 1, 1983 [JP] Japan .................................. 118072

[51] Int. Cl.⁵ .............................................. C23C 14/00
[52] U.S. Cl. ....................................... 118/719; 118/64; 118/58; 118/66; 118/72; 118/724; 118/725; 118/50
[58] Field of Search ................. 427/70; 118/719, 724, 118/725, 64, 66, 72, 58, 50

[56] References Cited

U.S. PATENT DOCUMENTS

| | | | |
|---|---|---|---|
| 2,382,432 | 8/1945 | McManus et al. | 118/719 X |
| 3,785,853 | 1/1974 | Kirkman | 118/719 |
| 4,015,558 | 4/1977 | Small et al. | 118/729 X |
| 4,047,624 | 9/1977 | Dorenbos | 118/719 X |
| 4,313,254 | 2/1982 | Feldman et al. | 118/719 X |
| 4,392,451 | 7/1983 | Mickelsen et al. | 118/718 X |
| 4,461,783 | 7/1984 | Yamazaki | 427/39 |
| 4,485,125 | 11/1984 | Izu et al. | 427/39 |
| 4,492,181 | 1/1985 | Ovshinsky | 118/718 |
| 4,666,734 | 5/1987 | Kamiya | 427/39 |

Primary Examiner—Shrive Beck
Assistant Examiner—Vi Duong Dang
Attorney, Agent, or Firm—Fitzpatrick, Cella, Harper & Scinto

[57] ABSTRACT

A process for producing a photoconductive member by introducing starting gases while heating a support to form a thin film having photoconductivity thereon in sequential steps comprises introducing a support into a chamber, heating the support to a desired temperature under reduced pressure, reacting the substrate with starting gases to form a thin film having photoconductivity thereon, cooling the substrate having a thin film and removing product support out of the chamber, these steps being carried out in sequential chamber throughout the steps, and an apparatus for producing the same.

8 Claims, 2 Drawing Sheets

PROCESS FOR PRODUCING PHOTOCONDUCTIVE MEMBER AND APPARATUS FOR PRODUCING THE SAME

This application is a continuation of application Ser. No. 07/734,116, filed Jul. 25, 1991, now abandoned, which, in turn, is a continuation of application Ser. No. 07/338,524, filed Apr. 14, 1989, now abandoned, which, in turn, is a continuation of application Ser. No. 06/883,865, filed Jul. 14, 1986, now abandoned, which, in turn, is a continuation of application Ser. No. 06/624,697, filed Jun. 26, 1984, now abandoned.

BACKGROUND OF THE INVENTION

1. Field of the Invention

This invention relates to process for producing a photoconductive member having sensitivity to electromagnetic waves such as light [herein used in a broad sense, including ultraviolet rays, visible light, infrared rays, X-rays, gamma-rays and the like] and a device for producing the same. More particularly, it pertains to a continuous process for producing a photoconductive member which comprises practicing formation of a thin photoconductive film while heating a support as in the CVD (chemical vapor deposition) process or the plasma CVD process and a device for producing the same.

2. Description of the Prior Arts

Photoconductive materials, which constitutes image forming members for electrophotography in solid state image pick-up devices or in the field of image formation, or photoconductive layers in manuscript reading devices, are required to have a high sensitivity, a high SN ratio [photocurrent $(I_p)$/ Dark current $(I_d)$], spectral characteristics matching to those of electromagnetic waves to be irradiated, a rapid response to light, a desired dark resistance value as well as lack of danger to human bodies during usage. Further, in a solid state image pick-up device, it is also required that the residual image should easily be treated within a predetermined time. In particular, in case of an image forming member for electrophotography to be assembled in an electrophotographic device to be used in an office as office apparatus, the aforesaid safety characteristic is very important.

From the standpoint as mentioned above, amorphous silicon [hereinafter referred to as a-Si] has recently attracted attention as a photoconductive material. For example, German Laid-Open Patent Publication No. 2746967 and 2855718 disclose applications of a-Si for use in image forming members for electrophotography, and German Laid-Open Patent Publication No. 2933411 an application of a-Si for use in a photoelectric conversion reading device.

The most primitive process among the processes for producing such photoconductive materials and the device for producing the same is the batch type in which the three steps of heating, forming the photoconductive layer and cooling are conducted in a single chamber. However, this process is not practical, because it is inefficient as the industrial production system. There is also a semi-batch type, in which either two continuous steps of heating, reaction and cooling are practiced in one chamber. This process also involves the same problems as in the batch type.

On the other hand, the continuous three chamber type is also known, in which the three steps of heating, reaction and cooling are practiced in three different chambers. However, in this continuous production process and the device for production thereof, since the heating chamber is opened whenever supports are conveyed into the chamber, the loss in heating energy is great. In addition, there is also the problem that the volume of the air to be discharged and leaked was great.

SUMMARY OF THE INVENTION

The present invention has been accomplished in view of the various points as mentioned above, and an object of the present invention to provide a continuous process for producing a photoconductive member having high productivity and a device for producing the same.

According to the present invention, there is to provide a process for producing a photoconductive member by introducing starting gases while heating a support to form a thin film having photoconductivity thereon in sequential steps, which comprises introducing a support into a chamber, heating the support to a desired temperature under reduced pressure, reacting the substrate with starting gases to form a thin film having photoconductivity thereon, cooling the substrate having a thin film and removing product support out of the chamber, these steps being carried out in sequential chambers throughout the steps.

According to another aspect of the present invention there is to provide an apparatus for producing a photoconductive member by introducing starting gases while heating a support to form a thin film having photoconductivity thereon, which comprises a chamber for preparing a support which can be brought to reduced pressure at least after introducing the support; a heating chamber which can be brought to reduced pressure and for heating the support to a desired temprature; a reaction chamber for forming a thin film having photoconductivity on the support which can be brought to reduced pressure, a cooling chamber for cooling the photoconductive member formed which can be brought to reduced pressure and a removing chamber which can be brought to reduced pressure after removing the photoconductive member, and said support being sequentially passed through the respective chambers to form the photoconductive member.

DETAILED DESCRIPTION OF THE PREFERRED EMBODIMENTS

Figure 1:
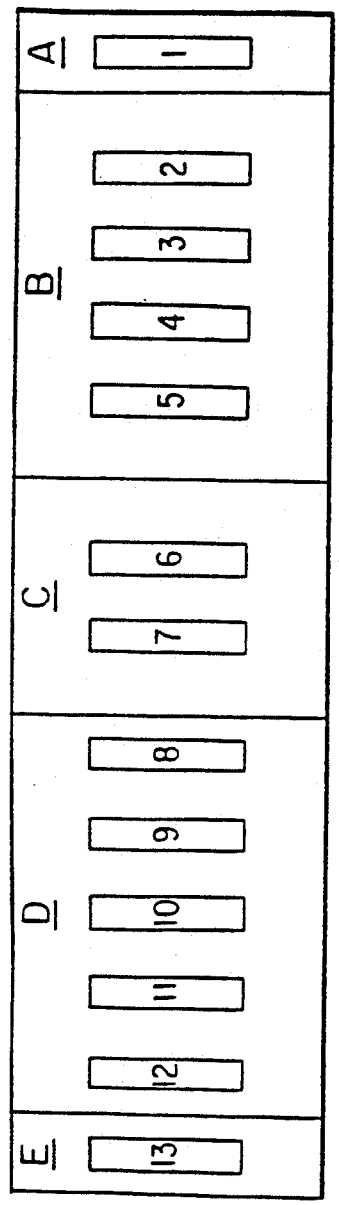
FIG. 1 shows a schematic chart for illustration of the process and the device for producing the photoconductive member according to the present invention.

Referring now to the drawings, the photoconductive member of the present invention is to be described in detail.

FIG. 1 shows a schematic chart for illustration of the process for producing the photoconductive member of this invention and the device for producing the same.

In production of the photoconductive member according to the present invention, the heating chamber B, the reaction chamber C and the cooling chamber D are brought to the states reduced previously to predetermined pressures, and the heating chamber B and the reaction chamber C should preferably be heated previously to predetermined temperatures, while the cooling chamber D cooled previously to a predetermined temperature.

The aforesaid support on which surface a thin film having photoconductivity is to be formed is conveyed into the preparation chamber A by opening the door at the inlet to the position 1. After the support is conveyed into the chamber A, the door is closed and the chamber is reduced to a desired pressure by actuating the evacuation pump. The preparation chamber A should preferably have a size with approximately the space in which only one support can be occupied, in order to minimize the volume of the air to be evacuated as small as possible.

Next, while the door at the inlet of the preparation chamber A is closed, the door at the inlet of the heating chamber B is opened, and the support is transferred to the heating chamber B of the position 2. After the support is conveyed into the chamber B, the door at the inlet of the heating chamber B is closed, and the preparation chamber A is evacuated to be prepared for receiving the next support. The heating chamber B is a chamber which fulfills the function of performing preparation so that the thin film having photoconductivity may be formed instantly on the support conveyed into the reaction chamber by heating previously the support to a predetermined temperature and maintaining the vacuum approximate to the reaction chamber C before forming the thin film having photoconductivity on the support in the reaction chamber C. In this example, a space to which supports can be conveyed is prepared and the supports conveyed are transferred successively from the position 2 to the position 5, and the supports upon reaching position 5 are heated to the predetermined temperature.

The support heated to the predetermined temperature is then conveyed after opening the door at the inlet of the reaction chamber C previously reduced to a predetermined pressure, while the door at the inlet of the chamber B is closed, to the position 6 in the reaction chamber C. After the support is conveyed, the door at the inlet of the reaction chamber C is closed, and the chamber C is reduced to a predetermined pressure by actuation of the evacuation pump. In the reaction chamber C, by laminating at least one kind of deposition layers, a thin film having conductivity can be formed. The deposition layer is constituted generally of a deposition layer having photoconductivity and containing a-Si as the main component. Other than such a deposition layer, it is also possible to provide a lower deposition layer between the deposition layer and the support and/or upper layer on the deposition layer. The starting gases to be introduced into the reaction chamber may include, in addition to silanes ($SiH_4$, $Si_2H_6$, $Si_3H_8$, $Si_4H_{10}$, etc.) as the a-Si film forming material, $H_2$ or rare gases as the base gas; $B_2H_6$, $PH_3$, $AsH_3$ for controlling p- or n-type conductivity; $N_2$, $NH_3$ for nitrogen doping; $N_2O$, $NO$ for oxygen doping; hydrocarbons for carbon doping such as $CH_4$, $C_2H_4$, etc.; and various gases known to be applicable for doping. These starting gases are mixed at a desired ratio by means of, for example, mass flow controllers, and fed into the reaction chamber C in amounts as desired.

As the method for producing a thin film having photoconductivity by exciting discharging in a gas atmosphere of starting materials while heating a support, there may be employed, for example, the so-called vacuum deposition method such as the glow discharge method, the sputtering method, the ion plating method and the like.

The photoconductive member completed of formation of a thin film having photoconductivity on the support in the chamber C is conveyed into the cooling chamber D after opening the door at the inlet thereof to the position 8 in the cooling chamber D, followed by closing of the door at the inlet of that cooling chamber D. The cooling chamber D cools the photoconductive member to a predetermined temperature prior to removing the photoconductive member produced from the removing chamber E. In this example, a space into which five photoconductive members can be conveyed is prepared in the cooling chamber D, the photoconductive members conveyed are successively transferred from the position 8 to the position 12, and the photoconductive members are cooled to the predetermined temperature when they are reached to the position 12.

As the next step, the door at the inlet of the removing chamber E reduced to a predetermined pressure is opened and the photoconductive member cooled to the predetermined temperature is conveyed to the position 13. After the photoconductive member is conveyed, the door at the inlet of the removing chamber E is closed, the removing chamber E is evacuated and thereafter the photoconductive member produced is removed out of the production device system by opening its door. The removing chamber E should preferably have a size approximate to a space into which only one photoconductive member can be occupied, in order to reduce the volume of the air to be evacuated as small as possible similarly as in the throwing chamber A.

Generally speaking, as the evacuation pump, in view of the balance between the vacuum required and productivity, there may be employed a rotary pump, a mechanical booster pump, a diffusion pump or a combination thereof.

In the production process and the production device of the present invention, it is also possible to provide an annealing chamber which can be brought to reduced pressure, for the purpose of practicing annealing treatment on the photoconductive member having formed thereon of a thin film having photoconductivity on the support in the reaction chamber C thereby to uniformize electrical and optical characteristics of the thin film having photoconductivity formed on the support.

Further, in order to prevent the problem caused by dust, etc. by previous washing, a washing chamber G may also be provided before the preparation chamber A.

The washing chamber G is a chamber for washing the support on which a thin film having photoconductivity is to be formed and is equipped with a washing means. For washing of the support, there may be generally employed the chemical treating method with the use of neutral detergent solution, pure water, alkali or oxygen. Otherwise, ozone treatment by UV-ray may also be applied. Thus, by connecting the washing chamber G directly to the preparation chamber A, it is possible to prevent lowering in characteristics of the photoconductive thin film based on attachment of dust, etc. after washing.

Further, in view of the shape of the reaction chamber C, a relay chamber H may also be provided. By providing relay chambers before and after the reaction chamber, the amount of heat and air moved based on the temperature difference and pressure difference between the heating chamber B and the reaction chamber C and between the reaction chamber C and the cooling chamber D can be reduced, whereby production with conservation of energy can be realized.

Figure 2:
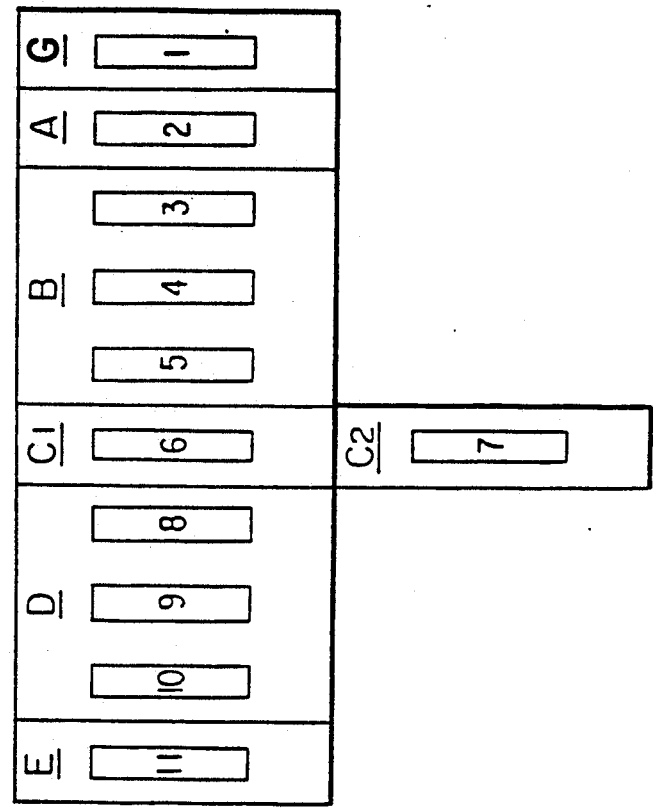
FIGS. 2, 3 and 4 show schematic charts for illustration of other embodiments of the process and the device for producing the photoconductive member of the present invention.

FIG. 2 shows a schematic chart for illustration of the production process and the production device of the present invention in which the washing chamber G and the relay chamber $C_1$ are further provided.

Figure 3:
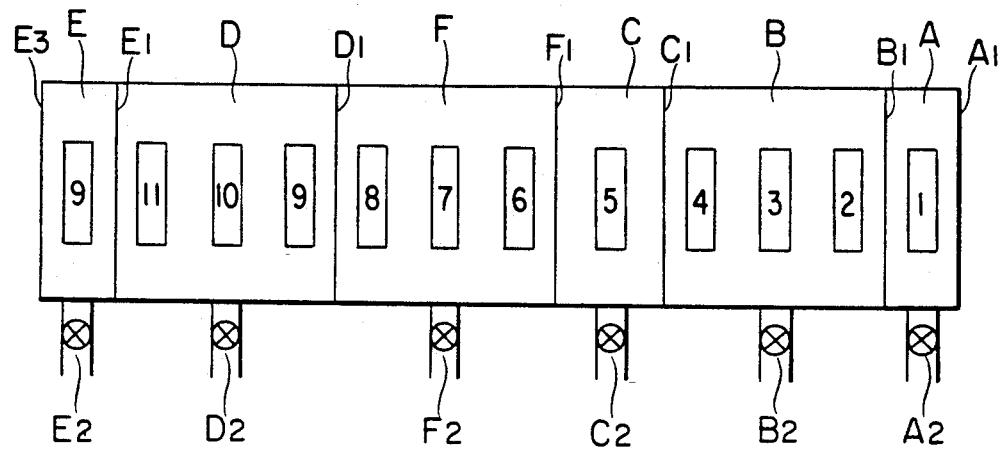

FIG. 3 shows a schematic chart for illustration of the production process and the production device of the present invention in which the annealing chamber F is further provided between the reaction chamber C and the cooling chamber D. Here, $A_2-F_2$ represent evacuation pumps, and $A_1-F_1$ represent the doors at the inlets of respective chambers A–F, $E_3$ being the door at the outlet.

Figure 4:
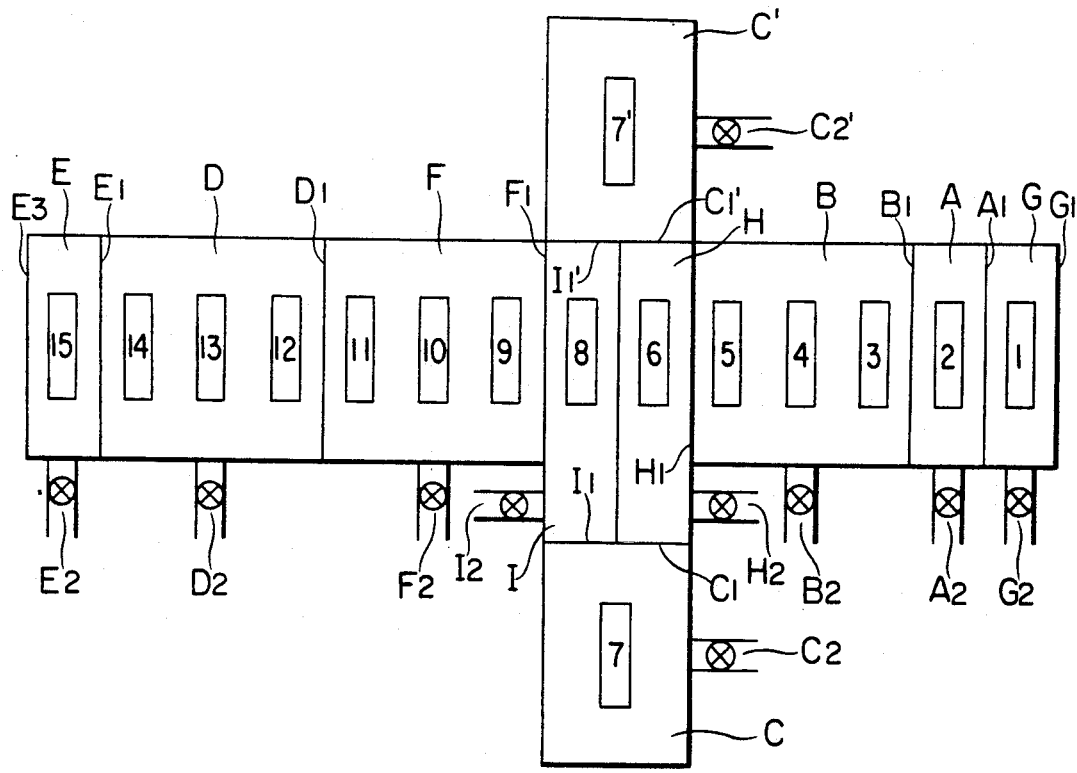

FIG. 4 shows a schematic chart for illustration of the production process and the production device of the present invention in which the washing chamber G, the relay chamber H and the annealing chamber F are further provided. Thus, by providing a relay chambers H and I between the reaction chamber C and the annealing chamber F, it is also possible to perform treatment under the conditions with different temperature and inner pressure between the reaction chamber C and the annealing chamber F. In particular, when the treating condition in the annealing chamber F is approximate to or higher than atmospheric pressure, its effect can be marked. Here, $G_1$ is the door at the inlet of the washing chamber, $G_2$, $H_2$, $I_2$ and $C_2'$ are each evacuation pump, and $H_1$, $I_1$ and $I_1'$ represent the doors of the relay chamber, respectively. In FIGS. 2 through 4, the numbers (1–11 in FIG. 2, 1–9 in FIG. 3 and 1–15 in FIG. 4) represent the order in which the respective supports are conveyed.

The support to be used in the production process and the production apparatus of the present invention may be either electroconductive or insulating. As the electroconductive material, there may be mentioned metals or alloys, typically Al, stainless steel and others. As insulating supports, there may conventionally be used films or sheets of heat-resistant synthetic resins, including polyester, polyamide, polyimide, etc., glasses, ceramics and so on. These insulating supports should preferably have at least one surface subjected to electroconductive treatment, and it is desirable to provide other layers on the side at which said electroconductive treatment has been applied. For example, electroconductive treatment of a glass can be effected by providing a thin film of NiCr, Al, Cr, etc. thereon. The support may have a shape which may be determined as desired. For example, when it is to be used as an image forming member for electrophotography, it may desirably be formed into an endless belt or a cylinder for use in continuous high speed copying. The support may have a thickness, which may suitably be determined so that a photoconductive member as desired may be formed. Generally, the thickness is preferably 10 μm or more from the points of fabrication and handling of the support as well as its mechanical strength.

As described in detail above by referring to the drawings, according to the production process and the production apparatus of the present invention, the heating chamber B and the reaction chamber C are constantly maintained under certain heated states, while the cooling chamber D constantly under certain cooled state, and one or more support can be introduced continuously into the heating chamber and one or more support can be cooled continuously in the cooling chamber, thus enabling continuous production of photoconductive members at good efficiency.

What I claim is:

1. An apparatus for producing continuously a photoconductive member for electrophotography by introducing starting gases while heating a support for electrophotography to form a film having photoconductivity thereon, said apparatus being subject to accumulation of dust from interior surfaces of said apparatus during use which adversely affects the electrical and optical characteristics of said photoconductive member comprising in sequence:
   (a) a preparation chamber for preparing a support for electrophotography which is brought to reduced pressure at least after introducing the support and having an inner volume sufficient to hold said support and to minimize the volume of air contained in order to promptly attain said reduced pressure;
   (b) a heating chamber having sufficient inner volume to hold a plurality of supports which is brought to reduced pressure and for heating the support to a desired temperature;
   (c) a reaction chamber for forming a thin film having photoconductivity on the support which is brought to reduced pressure;
   (d) a cooling chamber having an inner volume sufficient to facilitate cooling to a predetermined temperature during transportation of said support therethrough for cooling the photoconductive member formed which is brought to reduced pressure;
   (e) a removing chamber having an inner volume sufficient to hold said support and to minimize the volume of air contained therein in order to promptly attain said reduced pressure; and
   (f) a pressure reducing means for bringing each of the chambers (a) to (e) to the reduced pressure; wherein each of said preparation chamber, heating chamber, reaction chamber, cooling chamber and removing chamber is adapted to be brought to said reduced pressure, independently of the other said chambers, whereby said dust is reduced so as to improve the electrical and optical characteristics of said photoconductive member.

2. An apparatus according to claim 1, wherein a washing chamber is further provided before the preparation chamber.

3. An apparatus according to claim 1, wherein an annealing chamber is further provided between the reaction chamber and the cooling chamber.

4. An apparatus according to claim 1, wherein relay chambers are provided adjacent to the reaction chamber.

5. An apparatus according to claim 2, wherein an annealing chamber is further provided between the reaction chamber and the cooling chamber.

6. An apparatus according to claim 3, wherein relay chambers are provided adjacent to the reaction chamber.

7. An apparatus according to claim 2, wherein relay chambers are provided adjacent to the reaction chamber.

8. An apparatus according to claim 1 wherein doors are provided between respective chambers to evacuate them independently.

* * * * *